United States Patent [19]

Mielke

[11] 4,420,880

[45] Dec. 20, 1983

[54] DEVICE FOR EXTRACTING AN IN-LINE ARRAY OF SOCKET-MOUNTED CIRCUIT PACKAGES OF THE DUAL-IN-LINE-TYPE

[75] Inventor: Robert W. Mielke, Warrenville, Ill.

[73] Assignee: Western Electric Company, Inc., New York, N.Y.

[21] Appl. No.: 373,195

[22] Filed: Apr. 29, 1982

[51] Int. Cl.³ .................. B23P 19/00; H01R 43/00
[52] U.S. Cl. ................................. 29/764; 29/253; 29/829
[58] Field of Search ............... 29/764, 762, 253, 278, 29/829

[56] References Cited

U.S. PATENT DOCUMENTS

| | | | |
|---|---|---|---|
| 3,625,482 | 12/1971 | Viel | 254/28 |
| 3,797,092 | 3/1974 | Einarson | 29/741 |
| 3,846,895 | 11/1974 | Cosham et al. | 29/764 |
| 4,324,040 | 4/1982 | Gottlieb | 29/764 X |

Primary Examiner—Carl E. Hall
Attorney, Agent, or Firm—R. P. Miller; K. R. Bergum

[57] ABSTRACT

An extraction device (10) is adapted for removing a linear array of dual-in-line integrated circuit packages (12), referred to herein as DIPs, from a corresponding array of slotted receiving sockets (14), mounted on a test board (16), and for effecting the temporary magazine-storage of the extracted DIPs. The device comprises a composite elongated body member (21) formed with a forward wedge-shaped portion (23), of essentially T-shaped cross-section, an elongated rearward magazine-supporting portion (24) and a handle portion (27), the latter being located adjacent the rearwardmost end of the magazine-supporting portion (24), oriented downwardly and preferably being of pistol-grip configuration. The upper inclined surface of the forward wedge-shaped portion defines a DIP-extracting and guiding ramp (23b') of appreciable width, whereas the lower, longitudinally disposed edge of the forward portion is much narrower and is undercut on opposite sides to define a thin socket slot-receiving and device-guiding rib (23d). An elongated and relaceable DIP-storing magazine (28), preferably in the form of a U-shaped packing tube, is supported along the upper edge (24a) of the rearward body member portion (24), and preferably also along a co-linear upper edge section (23f) of the forward wedge-shaped body member portion (23). The elongated packing tube (28) is removably confined on the composite elongated body member (21) by at least two longitudinally spaced and oppositely oriented C-shaped brackets (32, 33).

15 Claims, 6 Drawing Figures

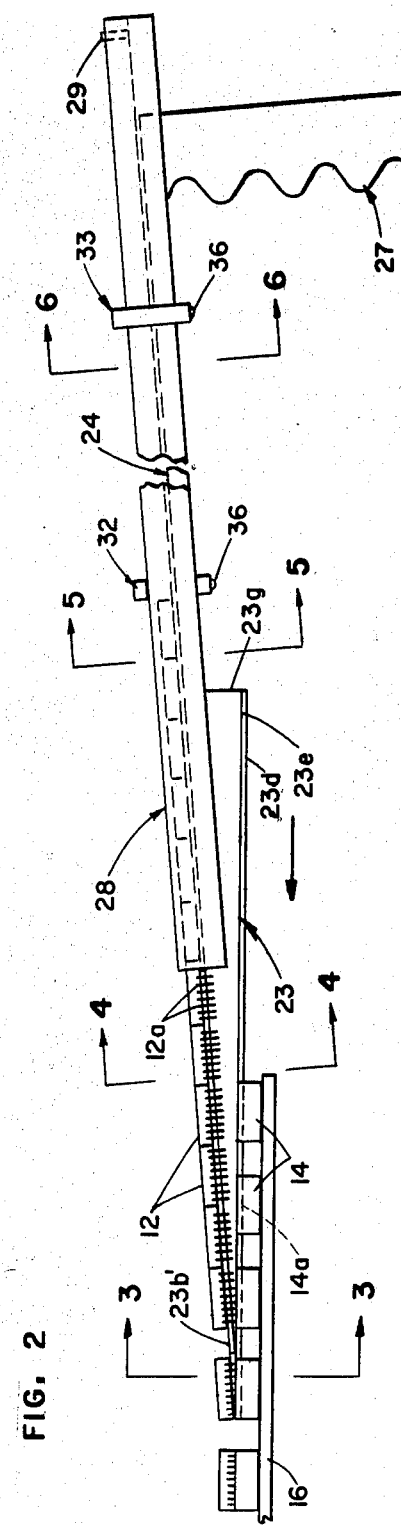
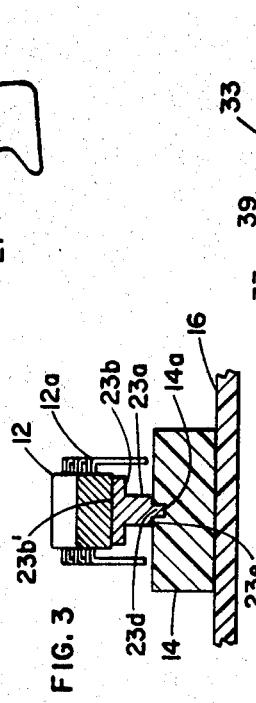
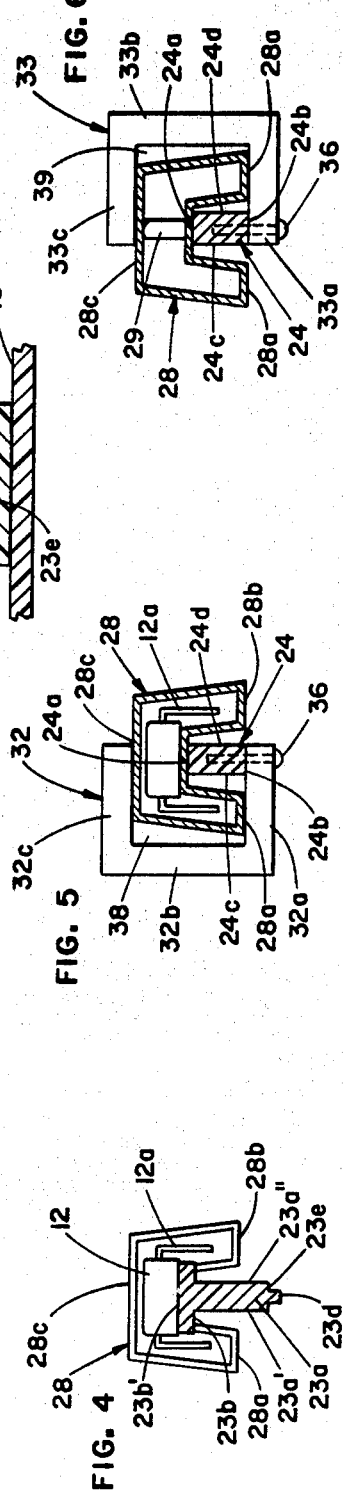
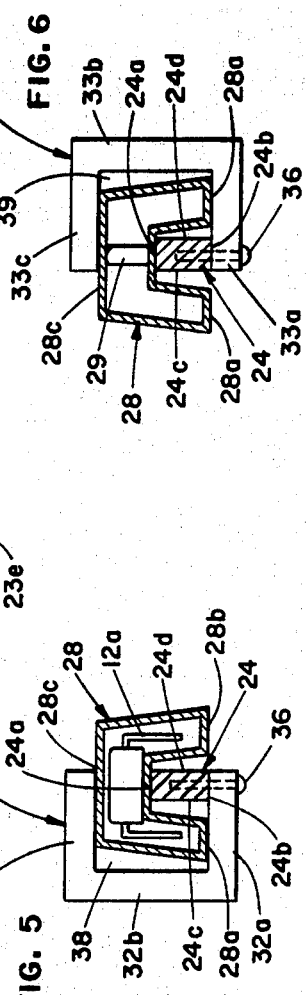
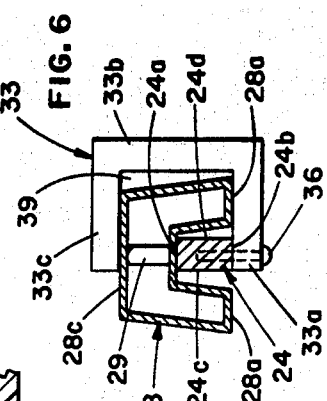

DEVICE FOR EXTRACTING AN IN-LINE ARRAY OF SOCKET-MOUNTED CIRCUIT PACKAGES OF THE DUAL-IN-LINE-TYPE

TECHNICAL FIELD

This invention relates to a device for removing in-line arrays of multi-leaded integrated circuit packages, such as of the dual-in-line package (DIP) type, from corresponding arrays of test board-mounted receiving sockets, and for effecting the temporary storage thereof within a replaceable storage magazine of a type that may also be employed with automatic component insertion equipment.

BACKGROUND OF THE INVENTION

In testing dual-in-line packages, generally referred to hereinafter simply as DIPs, it is often required to insert them in and extract them from a test board, one such type being referred to as a "burn-in" board. Such a board is typically formed with a plurality of parallel, inline rows of slotted DIP-receiving sockets, with the latter normally arranged in close end-to-end relationship both to conserve board space, and to facilitate the removal of the DIPs.

In connection with the required testing of most types of DIPs, considerable care must be taken during not only their insertion into, but extraction out of, the respectively associated sockets so as to neither damage the normally minute, closely spaced and fragile leads, nor the DIPs themselves. Considered more specifically, any appreciable non-uniform and/or non-linear extraction forces, of particular concern herein, can readily cause detrimental bending or twisting of the leads, or even induce stress fractures (cracks) in the body portions of the DIPs. Even only a small amount of bending of the leads during testing, of course, would normally require an additional lead-straightening operation thereafter, which is both time-consuming and expensive, before the DIPs could be permanently mounted, either manually or in an automated manner, in circuit boards (or in circuit packs) employed in the final assembly of any particular type of end-user equipment.

There have been a number of tools employed heretofore to extract multi-leaded circuit packages, and DIPs in particular, from associated lead-engaging sockets. One such tool basically comprises a pair of pivotally mounted gripping jaws that are adapted to grip opposite sides (or ends) of the body portion of a socket-mounted DIP. In using such a tool, it becomes readily apparent that it is not only very difficult to exert only linear upward extraction force on a gripped DIP, but such an operation is very time consuming and tedious when there are large numbers thereof to be extracted, and in a repetitive manner, as is the case when DIPs are to be only temporarily mounted on a test board, such as of the burn-in type.

There is disclosed in U.S. Pat. No. 3,846,895 another type of manually operated tool which is particularly adapted to sequentially remove a plurality of DIPs from a row of board-mounted sockets of the slotted type, and to temporarily store the extracted DIPs within a storage channel defined between one side and the upper edge of an elongated wedge-shaped member and an overlying cover permanently secured thereto. Such a permanently formed DIP-receiving storage channel disadvantageously necessitates that each extracted group of DIPs initially received therewithin must be transferred either in loose form to a suitable container, or seriatim "to an auxiliary storage tube of some type so as to free the tool for re-use. Regardless of how rows of such extracted DIPs are subsequently stored prior to use, or in preparation for shipping to another location, the additional handling of such relatively fragile multi-leaded devices often results in detrimental bending of the leads, as well as possible damage to the devices themselves because of excessive jarring, particularly when confined loosely within a storage container or bin.

The use of an extraction tool with a permanently formed storage channel or magazine necessarily also results in the latter having a fixed length. As such, the storage magazine cannot always accommodate all of the DIPs in a given row when, for example, either the size of the DIPs, or the number thereof in a given row, as socket-mounted on a test board, may vary from one DIP-testing application to another. Further restricting the number of DIPs that can be temporarily stored in the extraction tool disclosed in the cited patent, is the use of a handle portion that extends at least substantially axially rearward from the terminated end of the intermediate DIP-storing magazine.

There thus has been a definite need for an extraction device that is not only adapted to extract a plurality of in-line DIP-type integrated circuit packages from a corresponding number of test board-mounted slotted sockets, but which device is adapted to support, positionally confine and utilize an elongated, replaceable magazine of indefinite length, and of the type within which a given plurality of extracted DIPs may be temporarily stored, without any contact with the leads, and from which the DIPs may be subsequently fed directly into automatic component insertion apparatus.

SUMMARY OF THE INVENTION

In accordance with the principles of the present invention, one preferred illustrative extraction device for removing an in-line array of dual-in-line circuit packages (DIPs) from a corresponding array of test board-mounted slotted sockets, and for facilitating the temporary storage of the DIPs, comprises an elongated member formed with a forward wedge-shaped portion, an elongated rearward magazine-supporting portion and a pistol grip-type handle portion, the latter being either secured to, or formed as an integral extension of, the rearward body member portion, preferably at the furthermost end thereof. The wedge-shaped portion is essentially T-shaped in cross-section, with the upper surface of the horizontal leg thereof defining an inclined ramp, whereas the vertical leg thereof defines two mutually disposed wedge-shaped sidewalls that extend from essentially a point at their forwardmost ends to a common maximum height at their rearwardmost ends.

The lower edge of the forward wedge-shaped body member portion is formed with a continuous, longitudinally extending, and downwardly projecting thin rib that is dimensioned to be progressively received within each of a co-linear array of slots respectively formed in the upper body portions of the test board-mounted sockets in each row. Such a rib is thus seen to facilitate the alignment of the extraction device relative to an in-line array of slotted sockets. A forwardmost pointed and tapered end section of the wedge-shaped portion, which is forward of the leading end of the ramp, allows that end section to be initially readily inserted within the entrance region defined between the base of each socket slot and the underside of the overlying DIP so that the desired wedging action may commence against the latter.

In accordance with another aspect of the invention, the elongated rearward magazine-supporting body member portion, which may simply be of uniform rectangular cross-section, has a pair of longitudinally spaced, and oppositely oriented, C-shaped brackets secured thereto. Each bracket cooperates with a different adjacent sidewall and the common upper edge of the rearward body member portion so as to form two spaced and substantially enclosing magazine-confining channel areas. More specifically, it is through each of these channel areas that a different leg portion of a DIP-storing magazine, when in the form of a U-shaped packing tube, is inserted so as to be removably mounted on, and positionally confined along the upper edge of the rearward body member portion of the device.

In operation, the pointed forward end section of the wedge-shaped body member portion is initially inserted into the entrance end of the slot in the first socket of a given row thereof until wedged between the socket and the underside of the overlying socket-mounted DIP. Manual force is then exerted against the hand-held extraction device in the direction of the given row of DIPs. This gradually forces the leads of each successive DIP (without any appreciable bending of the leads) out of each successive and respectively associated socket. During that time, the ramp of the forward wedge-shaped portion of the device also functions as a guide track along which each successively extracted DIP is advanced until being fed seriatim into the aligned packing tube. The ramp is preferably dimensioned to have a width that allows the dual-in-line leads of the DIPs to straddle it in relatively close fitting relationship, thus preventing any skewing or jamming of the DIPs while being force-fed therealong.

In a typical application, a number of DIPs are extracted in succession until the packing tube is about to be filled, taking into account the maximum number of DIPs that can be supported on the ramp of the forward wedge-shaped body member portion before entering the packing tube. Such remaining ramp-mounted DIPs are readily advanced by gravity feed into the packing tube by simply tilting the extraction device until the ramp thereof acquires a sufficient angle of inclination in the opposite direction. Thereafter, the completely filled packing tube is readily removed from the extraction device by simply sliding it backwardly along the upper edge of the rearward body member portion until it is free of both of the channel areas defined in part by the C-shaped brackets. An empty packing tube may then be mounted in its place preparatory to the extraction of a new row (or rows) of socket-mounted DIPs.

DESCRIPTION OF THE DRAWINGS

FIG. 2 is a side elevational view of the composite extraction device of FIG. 1 and, in particular, illustrates the manner in which an in-line array of DIPs are successively extracted from a corresponding array of test board-mounted and slotted sockets;

FIG. 3 is a cross-sectional detail view, taken along the line 3—3 of FIG. 2, at a point midway along one of the test board-mounted sockets and, in particular, illustrates the manner in which the inclined ramp, lower edge and slot-nested rib of the forward wedge-shaped portion of the extraction device cooperate to effect a progressive wedging action between the top side of the socket and the underside of the overlying DIP to be extracted, as the device is moved from right to left, as viewed in FIG. 2, and FIGS. 4-6 are a related series of cross-sectional detail views, taken along the lines 4—4, 5—5 and 6—6 respectively of FIG. 2, with FIG. 4 illustrating the positional relationship of a DIP, after having been extracted from an associated socket, relative to the ramp of the wedge-shaped portion of the extraction device, with FIG. 5 showing a DIP after having been advanced into the associated packing tube, and the manner in which the latter is supported on the upper edge of the rearward portion of the device, and removably confined thereon in part by the first of two spaced C-shaped brackets, with FIG. 6 showing the second and oppositely directed C-shaped bracket and, in the absence of any DIPs from the line 6—6 rearward along the packing tube, in the interest of clarity, also revealing a stop member secured to, and located adjacent the rearward end of the packing tube.

DETAILED DESCRIPTION OF THE INVENTION

Figure 1:
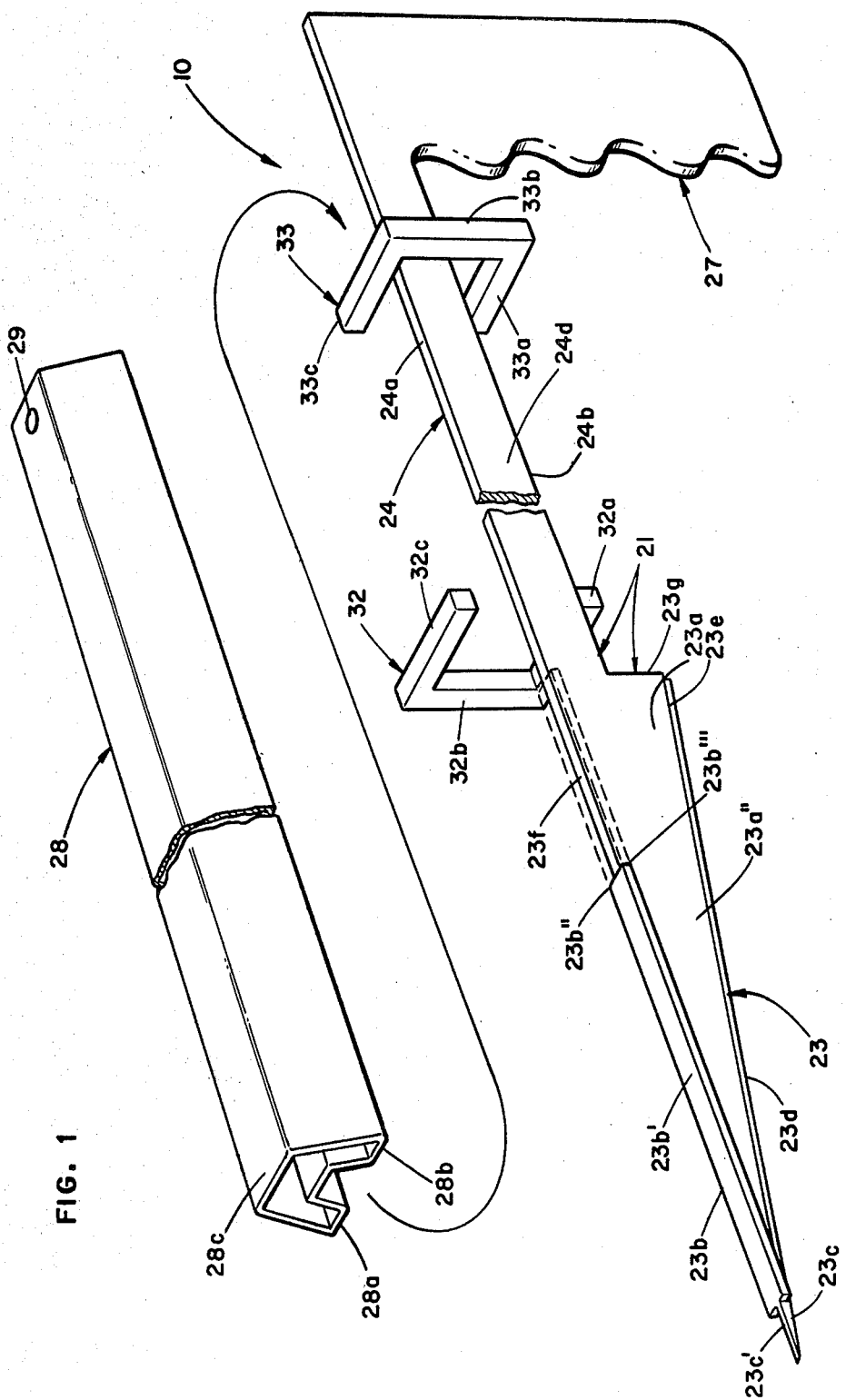
FIG. 1 is a perspective view of an extraction device embodying the principles of the present invention, with the associated and replaceable DIP-storing magazine, in the form of a U-shaped packing tube, being shown removed therefrom, as in an exploded view, in the interest of better illustrating certain of the structural details of the composite device.

It should be understood that while the invention is described in detail herein relative to effecting the extraction of DIP-type devices from slotted lead-receiving sockets, the subject extraction device is applicable for use in extracting many other types of slotted socket-mounted electronic modules, such as miniaturized circuit packs, components or devices having two (or more) longitudinally disposed, laterally spaced and downwardly extending arrays of leads.

With particular reference first to FIGS. 1-3, there is shown a manually operated extraction device 10 that is adapted to sequentially extract an in-line array of dual-in-line integrated circuit packages 12, generally referred to hereinafter as DIPs, from a corresponding array of respectively associated sockets 14, the latter typically being mounted on a test board 16, such as of the so-called "burn-in" type. Each socket, as best seen in FIG. 3, has a longitudinally disposed slot 14a that communicates with the upper surface of the body portion thereof, with the slot being located intermediate two rows of conventional lead-engaging socket receptacles (not shown). As the sockets 14 are preferably aligned and spaced in relatively close back-to-back relationship in each row on a typical test board, so as to conserve space, an essentially segmented composite rectilinear slot is formed by each row of sockets. The function of such slots relative to the construction and mode of operation of the extraction device 10 will be considered in greater detail hereinbelow.

With particular reference now to FIGS. 1 and 4, the extraction device 10 as embodied herein comprises an elongated body member 21 having a forward wedge-shaped portion 23, of essentially T-shaped cross-section, an elongated rearward magazine-supporting portion 24, which may be of uniform rectangular cross-section, and a handle portion 27, preferably of pistol-grip configuration, the latter being shown formed as an integral downward end extension of the rearward body member portion 24. It should be understood, of course, that the handle portion 27 could take a number of different forms from that shown, including being contoured in three dimensions, if desired, and secured to the rearward body member portion 24 in any suitable manner.

As best seen in FIG. 1, the forward wedge-shaped body member portion 23, in being essentially T-shaped in cross-section, includes a wedge-shaped or tapered vertical leg 23a that merges into an upper horizontally disposed leg 23b, the upper surface of the latter defining an inclined ramp 23b' along which the successively extracted DIPs 12 are advanced in back-to-back relationship. The width of the ramp 23b' is preferably chosen so as to allow the two rows of leads 12a of any particular DIP being extracted to extend downwardly on opposite respective sides of, and thus straddle, the ramp in relatively close-fitting relationship therewith. This prevents the DIPs from becoming skewed, or jammed, while being advanced in a force-fed manner therealong.

As best seen in FIG. 1, the forward end of the ramp 23b merges into a forwardmost pointed end section 23c of the wedge-shaped body member portion 23. This pointed end section 23c actually comprises an extension of a thin, longitudinally disposed rib 23d, of rectangular cross-section, that projects a short predetermined distance downwardly from, and extends along the center line of, the otherwise lower edge 23e (best seen in FIG. 4) of the wedge-shaped body member portion 23. The rib 23d is dimensioned to be received within, and in relatively close-fitting relationship with, the aligned rectangular socket slots 14a (see FIG. 3). As such, the rib 23d is seen to cooperate with the linear array of socket slots 14a to ensure that the extraction device 10 will be reliably guided between the dual-in-line leads of each successive DIP while being extracted in a given row. As thus guided, the extraction device cannot come in contact with and bend, or otherwise damage, the relatively fragile leads of the DIPs. When the rib 23d is also dimensioned such that the base thereof abuts against the base of each receiving socket slot 14a, as shown in FIG. 3, the rib further cooperates with the lower laterally disposed edges 23e defined on either side of the rib in effecting the desired wedging action against each DIP during the extraction thereof.

The degree of taper of the ramp 23b' is chosen such that the leads of each extracted DIP are very gradually forced out of the associated socket 14, with uniform and substantially linear forces imparted thereagainst, so as to prevent any deterimental, if any, non-contact bending of the leads. This result is further insured by forming the upper edge 23c' of the forwardmost pointed end section 23c of the wedge-shaped body member portion 23 to be inclined at the same angle, and formed as an extension of, the ramp 23b'. By way of example only, with the ramp 23b' formed at an angle in the range of 4 to 10 degrees with respect to the normally horizontal rib 23d of the wedge-shaped body member portion 23, the dual-in-line leads of an array of DIPs may normally be progressively and reliably extracted from a corresponding array of slotted sockets without the occurrence of any detrimental bending or twisting of the leads. It is understood, of course, that both the longitudinal length of each row of leads of a given DIP, as well as the socket-inserted depth of the leads, would have a direct bearing on what the ideal angle of inclination should be for the ramp in any given DIP extraction application.

In accordance with another aspect of the invention, an elongated DIP-storing magazine, preferably in the form of a U-shaped packing tube 28 (best seen in FIGS. 1, 5 and 6), is removably mounted on and extends along at least the top edge 24a of the rearward body member portion 24. In the illustrative embodiment of the invention, as depicted in FIG. 2, a forward end portion of the packing tube 28 is also mounted on an upper rearward edge 23f of the wedge-shaped body member portion 23. The actual length of the upper edge 23f is determined, of course, by the chosen rearward termination point for the ramp 23b'. As best seen in solid line form of FIG. 1, that point in the illustrative embodiment is appreciably forward of the widest dimension of the parallel sidewalls 23a', 23a" of the wedge-shaped body member portion, that dimension being defined by the rearwardmost common vertical edge 23g thereof.

In this regard, it should be appreciated that there is a limit as to how far forward along the wedge-shaped body member portion 23 the rearward end of the ramp 23b' may be located. Specifically, that end of the ramp must not be so close to the underlying longitudinally disposed edges 23e, on opposite sides of the rib 23d, that the bottom forward edges of the leg portions 28a and b of a mounted packing tube would contact the upper surface of each socket 14 as the extraction device is advanced therealong. With that in mind, the rearward end of the ramp 23b' can actually be chosen to terminate anywhere along that section thereof shown in phantom in FIG. 1, without in any way affecting the profile of the rearward body member portion 24. The latter portion is preferably of uniform rectangular cross-section, at least until merging into the handle portion 27, so as to simplify the construction of the device.

Regardless where the rearward end of the ramp 23b' is chosen to terminate along the wedge-shaped body member portion 23, the resulting opposite side, laterally disposed ends 23b" and 23b'" advantageously function as respective forward stops for the two downwardly and oppositely inclined leg portions 28a and b of a properly mounted packing tube 28.

The packing tube is removably confined on the upper edge 24a of the rearward body member portion 24, in particular, by a pair of longitudinally disposed and oppositely oriented C-shaped brackets 32 and 33, best seen in FIGS. 5 and 6. The lower leg portions 32a and 33a of the brackets are secured in any suitable manner, such as by one or more threaded fasteners 36, to the lower edge 24b of the rearward body member portion 24. As configured and dimensioned, the intermediate leg portions 32b and 33b of the C-shaped brackets overlie respective opposite sidewalls 24c and d of the rearward body member portion 24, whereas the upper bracket leg portions 32c and 33c overlie the common upper edge 24a of the same body member portion. As such, the brackets 32, 33 are seen to cooperate with the rearward body member portion 24 to define short, longitudinally disposed guide channels 38, 39 through which the packing tube leg portions 28a and 28b are respectively advanced until the forward ends thereof abut against the aligned one of the aforementioned stop-functioning ends 23b" and 23b'" (identified only in FIG. 1) of the wedge-shaped portion ramp 23b'.

It is thus seen that the C-shaped brackets 32, 33 provide a simple and reliable way of positionally confining at least the major length of a given packing tube 28 on the upper edge 24a of the rearward body member portion 24 of the composite extraction device 10. While the brackets 32, 33 have been shown as being of three-sided (C-shaped) configuration, it should be apparent that they may be configured to provide a channel or nesting recess 38 or 39 of any desired shape so as to be compatible with the profile of any particular type of packing tube required for a given type of DIP (or any other dual-in-line leaded component or device). In this connection, it should also be understood that while both the forward and rearward body member portions 23 and 24 are shown with planar sidewalls, they need not be either planar or parallel as long as they are compatible with the particular profile of both the DIPs to be extracted, and the packing tube within which the DIPs are to be temporarily stored.

In addition, while the elongated body member 21 of the composite extraction device 10 is shown as being of one-piece construction in the illustrative embodiment, the various longitudinally disposed portions thereof of different cross-section could readily be formed as separate sections, and rigidly secured together through the utilization of any one of a number of conventional fabricating techniques. It is also apparent that the elongated body member 21, whether of one piece or multiple piece construction, can be formed out of many different metal, wood or plastic materials, as long as such other materials would exhibit the required rigidity, particularly with respect to some of the necessarily very thin and/or pointed structural details thereof. The elongated body member may also be formed through the use of well known machining, extrusion or molding processes, as may be appropriate for the particular material employed. In the illustrative embodiment, the unitary body member 21 was machined out of aluminum bar stock.

A typical DIP extraction operation utilizing the extraction device 10 embodied herein will now be described. After an empty packing tube 28 has been mounted on the upper edge 24a of the rearward body member portion 24, and on the short rearward upper edge section 23f of the forward body member portion 23, an operator grasps the handle portion 27, with the thumb and/or forefinger resting against a side region of the packing tube 28 so as to prevent any relative axial displacement between the latter and the unitary body member 21. In this regard, it should be understood, of course, that any suitable clamping member, such as a threaded fastener with a wing nut (not shown), extending through a tapped hole in a leg portion of one of the C-shaped brackets 32 or 33, or a suitably configured rearward clamping member (not shown) secured to the handle portion 27, could be readily employed to bias against any outer wall surface (or end) of the packing tube, and, thereby, effectively lock the latter to the elongated body member 21 of the composite extraction device 10. In any event, with an empty packing tube properly mounted on the elongated body member 21, the forwardmost pointed end section 23c thereof is inserted into the entrance end of the slot 14a in the first socket 14 in a given row thereof, as mounted on the test board 16. At that point, the positional relationship between the extraction device 10, socket 14 and a given DIP 12 is best seen in FIG. 3.

Manual force is thereafter exerted against the extraction device in the axial direction of the particular row of DIPs to be extracted (see FIG. 2). During such advancement, the slight taper of the device ramp 23b' wedges against the underside of the body portion of each successive DIP 12, so as to gradually force the leads thereof out of the respectively associated socket 14. Each such successively extracted DIP 12 is thereafter advanced upwardly along the remaining portion of the ramp 23b' and force-fed seriatim into the packing tube 28.

As peviously noted, the width of the ramp 23b' is preferably dimensioned so as to allow the dual-in-line arrays of leads of each DIP to straddle the ramp while being in relatively close fit relationship with the opposite edges thereof so as to minimize any detrimental skewing or jamming of the DIPs while being force-fed therealong. Should the walls of a given packing tube have appreciable thickness, the longitudinally extending and co-linear upper edge 23f and 24a of the forward and rearward body member portions 23 and 24, respectively, could be undercut (not shown) relative to the rearward end of the ramp 23b' by an amount approximately equal to the actual packing tube wall thickness. This would result in a very smooth transition from the rearward end of the ramp 23b' to the immediately adjacent forward end, and inner surface, of the lower wall of the intermediate leg portion 28c of the packing tube. Such an undercut body member upper edge, however, has not been found necessary with known packing tubes currently available for temporarily storing DIPs.

Assuming at this point in the illustrative operating example that the length of the packing tube 28 has been chosen so as to accommodate the storage of all of the DIPs 12 in a given row as mounted on the test board 16, there will be at least several DIPs that remain on the ramp 23b' after the last DIP has been extracted along a given row therefore. This situation may be visualized from the illustrative application of the extraction device depicted in FIG. 2, where approximately seven representative DIPs are shown supported on the ramp 23b' at any point in time between the extraction of the seventh DIP along a given row and the last DIP in that row. Whatever number of DIPs remain on the ramp 23b' after the last DIP has been extracted from a given row, or at such time that the packing tube would become filled, when taking into account those DIPS remaining on the ramp, the latter DIPs may be readily advanced into the packing tube by an operator simply tilting the extraction device 10 such that the elevation of the handle portion 27 is appreciably lower than that of the ramp 23b'. This, of course, causes the last few extracted DIPs to be advanced by gravity feed into the remaining unfilled forward end of the packing tube 28.

Upon a plurality of socket-extracted DIPs having been loaded into a packing tube of the type disclosed, they may subsequently and advantageously be directly machine-inserted from the packing tube into circuit boards (or circuit packs) that form part of electronic equipment (not shown) to be assembled. By simply taping the forward end of each loaded packing tube 28, for example, the latter also provides an ideal way to either temporarily store large quantities of tested DIPs, or to transport them from one location to another, without subjecting the relatively fragile leads thereof to any detrimental bending. The use of an adhesive tape, of course, could also be used in place of the illustrated stop member 29 at the rearward end of each packing tube 28, if desired, in a given application.

It should also be appreciated that the length of the packing tube 28 advantageously is in no way restricted by the actual length of the elongated body member 21, as measured from the rearward end of the ramp 23b' to the furthermost end of the body member portion 24. Rather, as illustrated in FIG. 2, the packing tube 28 may actually extend any desired, practical distance beyond the rearward end of the body member portion 24. This makes the composite device 10 readily applicable for use in extracting and temporarily storing DIPs that may not only vary in size, but be socket-mounted on different test boards wherein the sockets in each row may vary in number, for example.

While a preferred composite extraction device has been disclosed herein for successively extracting an in-line array of DIPs from a corresponding array of board-mounted slotted sockets, and for effecting the temporary storage of the extracted DIPs within a replaceable storage magazine, it is obvious that various modifications may be made to the present illustrative claimed embodiment of the invention, and that a number of alternative related embodiments could be devised by one skilled in the art without departing from the spriit and scope of the invention.

What is claimed is:

1. An extraction device for successively removing a linear array of multi-leaded integrated circuit packages, of the type having dual-in-line leads, from a corresponding array of respectively associated support board-mounted sockets, and for facilitating the temporary replaceable-magazine storage of such extracted circuit packages, and wherein each socket is formed with a guide slot that communicates with the upper surface thereof, and which slot is positioned to extend parallel to, and be interposed between, the laterally spaced rows of leads of a socket-mounted circuit package, said extraction device comprising:

an elongated composite body member that includes:
  a. a forward wedge-shaped portion having an upper, longitudinally extending and inclined ramp for effecting the successive extraction of an array of socket-mounted circuit packages, and guiding the latter in back-to-back relationship into a replaceable storage magazine when mounted on said device, said wedge-shaped portion further having a lower edge from which a thin, longitudinally extending socket slot-receiving rib projects downwardly a predetermined distance;
  b. an elongated rearward portion having an upper edge that is particularly for supporting the intermediate leg portion of a substantially U-shaped type of circuit package storage magazine along at least a major portion of the longitudinal length of the latter, said upper magazine-supporting edge being co-linear with, but substantially narrower than, the width of said wedge-shaped portion ramp, and
  c. a handle portion positioned at a predetermined point along said rearward magazine-supporting portion, and extending downwardly therefrom, said extraction device further including:

bracket means secured to said rearward body member portion, and cooperating with opposite major sides and said upper magazine-supporting edge of said rearward portion to define on each side of the latter at least one substantially enclosing channel area, each of said opposite side channel areas receiving a longitudinal section of a different leg portion of a storage magazine of the U-shaped type to be removably confined therewithin.

2. An extraction device in accordance with claim 1 wherein in said elongated composite body member, said forward wedge-shaped portion is of essentially T-shaped configuration, exclusive of said longitudinally extending underlying rib, said rearward magazine-supporting portion is of rectangular configuration, with the narrowest surface areas thereof defining said upper and a lower edge, and said handle portion is of pistol-grip configuration and positioned adjacent the furthermost end of said rearward body member portion.

3. An extraction device in accordance with claim 2 wherein said forward wedge-shaped portion, rearward magazine-supporting portion and pistol-grip type handle portion are all integral parts of said composite body member.

4. An extraction device in accordance with claim 2 wherein said bracket means comprises at least two longitudinally spaced brackets of three-sided, substantially C-shaped, configuration, with a lower leg of each bracket being secured to the lower edge, and oriented to extend perpendicularly outward from a different side, of said rearward body member portion, the lower leg, together with an intermediate and an upper leg of each bracket further being dimensioned to cooperate with the adjacent side and upper edge of said rearward body member portion to define one of at least said two substantially enclosed magazine leg portion-confining channel areas therebetween.

5. An extraction device in accordance with claim 2 wherein the rearward end of said ramp terminates a predetermined distance forward of that point defining the widest dimension of said wedge-shaped body member portion, and wherein the resulting upper inclined surface of the of the latter that is rearward of said ramp defines a terminating edge section that is of the same width as, and co-linear with, the upper edge of said rearward body member portion and, thus, said edge section supporting a coextensive forward end section of a U-shaped storage magazine when mounted on said device.

6. A extraction device in accordance with claim 4 wherein said forward wedge-shaped portion, rearward magazine-supporting portion and pistol-grip type handle portion are all integral parts of said composite body member.

7. An extraction device in accordance with claim 4 wherein said wedge-shaped body member portion includes a tapered and substantially pointed end section forward of said ramp, said end section being formed at least in part as an extension of, and having the width of, said thin underlying rib, with the upper surface of said end section having an angle of inclination, and length, such that the rearward end thereof smoothly merges into the forward end of said ramp, and wherein the rearward end of said ramp, in having a width greater than that of the upper edge of said rearward body member portion, defines opposite side, laterally disposed, ends that each functions as a positive forward stop for a different downwardly extending leg portion of a U-shaped storage magazine of the packing tube type when mounted on said device.

8. An extraction device in accordance with claim 7 wherein the rearward end of said ramp terminates a predetermined distance forward of that point defining the widest dimension of said wedge-shaped body member portion, and wherein the resulting upper inclined surface of the latter that is rearward of said ramp defines a terminating edge section that is of the same width as, and co-linear with, the upper edge of said rearward body member portion and, thus, said edge section supporting a coextensive forward end section of a U-shaped storage magazine when mounted on said device.

9. An extraction device for successively removing a linear array of multi-leaded integrated circuit packages, of the type having dual-in-line leads, from a corresponding array of respectively associated support board-mounted sockets, and for storing such extracted circuit packages, and wherein each socket is formed with a guide slot that communicates with the upper surface thereof, and which slot is positioned to extend parallel to, and be interposed between, the laterally spaced rows of leads of a socket-mounted circuit package, said extraction device comprising:

an elongated composite body member that includes:
a. a forward wedge-shaped portion having an upper, longitudinally extending and inclined ramp for effecting the successive extraction of an array of socket-mounted circuit packages, and guiding the latter therealong in back-to-back relationship so as to facilitate the magazine storage thereof, said wedge-shaped portion further having a lower edge from which a thin, longitudinally extending socket slot-receiving rib projects downwardly a predetermined distance;
b. an elongated rearward portion having an upper edge that is particularly for supporting only the intermediate leg portion of a substantially U-shaped type of circuit package storage magazine along at least a major portion of the longitudinal length of the latter, said upper magazine-supporting edge being co-linear with, but substantially narrower than, the width of said wedge-shaped portion ramp, and
c. a handle portion positioned at a predetermined point along said rearward magazine-supporting portion, and extending downwardly therefrom, said extraction device further including:

bracket means secured to said rearward body member portion, and cooperating with opposite major sides and said upper magazine-supporting edge of said rearward portion to define on each side of the latter at least one substantially enclosing channel area, each of said opposite side channel areas receiving a longitudinal section of a different leg portion of a U-shaped storage magazine to be removably confined therewithin, and an elongated, replaceable circuit package storage magazine mounted at least in part on the upper edge of said rearward body member portion, said magazine, as mounted, defining an inner chamber of substantially inverted U-shaped configuration, with the downwardly extending leg portions thereof straddling said rearward body member portion, and the inner wall of the intermediate magazine leg portion being supported on the upper edge of said last-mentioned member portion, said magazine further including stop means located at the rearwardmost end thereof, as mounted.

10. An extraction device in accordance with claim 9 wherein said elongated composite body member is of one piece construction, and in which said forward wedge-shaped portion is of essentially T-shaped configuration, exclusive of said longitudinally extending underlying rib, said rearward magazine-supporting portion is of rectangular configuration, with the narrowest surface areas thereof defining said upper and a lower edge, and said handle portion is of pistol-grip configuration and positioned adjacent the furthermost end of said rearward body member portion.

11. An extraction device in accordance with claim 9 wherein said bracket means comprises at least two longitudinally spaced brackets of three-sided configuration, with a lower leg of each bracket being secured to the lower edge, and oriented to extend perpendicularly outward from a different side, of said rearward body member portion, the lower leg, together with an intermediate and an upper leg of each bracket further being dimensioned to cooperate with the adjacent side and upper edge of said rearward body member portion to define one of at least said two substantially enclosed magazine leg portion-confining channel areas therebetween.

12. An extraction device in accordance with claim 10 wherein the rearward end of said ramp terminates a predetermined distance forward of that point defining the widest dimension of said wedge-shaped body member portion, and wherein the resulting upper inclined surface of the latter that is rearward of said ramp defines a terminating edge section that is of the same width as, and co-linear with, the upper edge of said rearward body member portion and, thus, said edge section supporting a coextensive forward end section of said U-shaped storage magazine.

13. An extraction device in accordance with claim 11 wherein said forward wedge-shaped portion, rearward magazine-supporting portion and pistol-grip type handle portion are all integral parts of said composite body member.

14. An extraction device in accordance with claim 11 wherein said wedge-shaped body member portion includes a tapered and substantially pointed end section forward of said ramp, said end section being formed at least in part as an extension of, and having the width of, said thin underlying rib, with the upper surface of said end section having an angle of inclination, and length, such that the rearward end thereof smoothly merges into the forward end of said ramp, and wherein the rearward end of said ramp, in having a width greater than that of the upper edge of said rearward body member portion, defines opposite side, laterally disposed, ends that each functions as a positive forward stop for a different one of the downwardly extending leg portions of said U-shaped storage magazine.

15. An extraction device in accordance with claim 14 wherein the rearward end of said ramp terminates a predetermined distance forward of that point defining the widest dimension of said wedge-shaped body member portion, and wherein the resulting upper inclined surface of the latter that is rearward of said ramp defines a terminating edge section that is of the same width as, and co-linear with, the upper edge of said rearward body member portion and, thus, said edge section supporting a coextensive forward end section of said U-shaped storage magazine.

* * * * *